United States Patent
Sutardja et al.

(10) Patent No.: US 8,891,330 B2
(45) Date of Patent: Nov. 18, 2014

(54) METHOD AND APPARATUS FOR SIMULTANEOUSLY ACCESSING A PLURALITY OF MEMORY CELLS IN A MEMORY ARRAY TO PERFORM A READ OPERATION AND/OR A WRITE OPERATION

(71) Applicant: Marvell World Trade Ltd., St. Michael (BB)

(72) Inventors: Pantas Sutardja, Los Gatos, CA (US); Winston Lee, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/223,335

(22) Filed: Mar. 24, 2014

(65) Prior Publication Data
US 2014/0204682 A1    Jul. 24, 2014

Related U.S. Application Data

(63) Continuation of application No. 13/926,485, filed on Jun. 25, 2013, now Pat. No. 8,681,553, which is a continuation of application No. 13/527,119, filed on Jun. 19, 2012, now Pat. No. 8,472,277, which is a continuation of application No. 13/214,543, filed on Aug. 22, 2011, now Pat. No. 8,203,902, which is a continuation of application No. 12/364,055, filed on Feb. 2, 2009, now Pat. No. 8,004,926.

(60) Provisional application No. 61/026,220, filed on Feb. 5, 2008.

(51) Int. Cl.
*G11C 8/00* (2006.01)
*G11C 7/10* (2006.01)

(52) U.S. Cl.
CPC .................................. *G11C 7/10* (2013.01)
USPC ............ 365/230.03; 365/185.13; 365/189.04; 365/189.19

(58) Field of Classification Search
CPC ............. G11C 13/004; G11C 13/0069; G11C 2207/2209
USPC .............. 365/230.03, 185.13, 189.04, 189.19
See application file for complete search history.

(56) References Cited

U.S. PATENT DOCUMENTS

| | | | |
|---|---|---|---|
| 4,984,204 A | * | 1/1991 | Sato et al. ................. 365/189.11 |
| 6,104,663 A | | 8/2000 | Kablanian |

(Continued)

FOREIGN PATENT DOCUMENTS

| | | |
|---|---|---|
| EP | 0834881 A1 | 4/1998 |
| EP | 1376597 A2 | 1/2004 |
| EP | 1708202 A2 | 10/2006 |

OTHER PUBLICATIONS

International Search Report for International Application No. PCT/US2009/033040, mailed May 19, 2009.

*Primary Examiner* — Tuan T Nguyen (57) ABSTRACT

A memory system includes a memory array and a read/write module. The memory array includes bit lines, word lines, and memory cells. Each of the memory cells is located at an intersection of a respective one of the bit lines and a respective one of the word lines. The memory cells include a first memory cell and a second memory cell. The first memory cell is located at the intersection of a first bit line of the bit lines and a first word line of the word lines. The second memory cell is located at the intersection of a second bit line of the bit lines and a second word line of the word lines. The read/write module is configured to concurrently activate the first memory cell and the second memory cell to simultaneously access both the first memory cell and the second memory cell.

20 Claims, 11 Drawing Sheets

(56) References Cited

U.S. PATENT DOCUMENTS

| | | |
|---|---|---|
| 6,118,724 A | 9/2000 | Higginbottom |
| 6,198,667 B1 | 3/2001 | Joo |
| 6,646,954 B2 | 11/2003 | Winograd et al. |
| 6,650,572 B2 | 11/2003 | Issa |
| 7,230,872 B2 | 6/2007 | Winograd et al. |
| 7,643,334 B1 * | 1/2010 | Lee et al. .................. 365/163 |
| 7,719,920 B2 | 5/2010 | Anvar et al. |
| 8,085,615 B2 * | 12/2011 | Taguchi ................ 365/230.06 |
| 8,154,941 B2 * | 4/2012 | Ito .......................... 365/225.7 |
| 2002/0031007 A1 * | 3/2002 | Osada et al. ................ 365/156 |
| 2003/0179635 A1 | 9/2003 | Terzioglu et al. |
| 2003/0202408 A1 | 10/2003 | Chobotaro et al. |
| 2004/0017709 A1 | 1/2004 | Braceras |
| 2004/0208037 A1 | 10/2004 | Winograd et al. |
| 2006/0023500 A1 | 2/2006 | Kawabata et al. |
| 2006/0126413 A1 * | 6/2006 | Liaw ........................ 365/210 |
| 2006/0158952 A1 | 7/2006 | Suh |
| 2007/0109886 A1 | 5/2007 | Terzioglu et al. |
| 2008/0175035 A1 | 7/2008 | Taguchi |
| 2008/0285334 A1 * | 11/2008 | Chow et al. ................ 365/163 |
| 2010/0182819 A1 | 7/2010 | Matsufuji et al. |
| 2010/0214831 A1 * | 8/2010 | Kim et al. .................. 365/163 |
| 2011/0141836 A1 | 6/2011 | Luthra et al. |
| 2012/0087169 A1 | 4/2012 | Kuo et al. |
| 2012/0092930 A1 * | 4/2012 | Yamamura et al. ...... 365/185.11 |
| 2012/0127805 A1 | 5/2012 | Dreesen et al. |
| 2013/0141959 A1 | 6/2013 | Kawasumi |
| 2013/0170283 A1 | 7/2013 | Lan et al. |
| 2013/0194857 A1 | 8/2013 | Miyamoto |
| 2013/0208530 A1 | 8/2013 | Oh et al. |
| 2013/0215698 A1 | 8/2013 | Nagata |
| 2013/0223170 A1 | 8/2013 | Kajigaya |

* cited by examiner

METHOD AND APPARATUS FOR SIMULTANEOUSLY ACCESSING A PLURALITY OF MEMORY CELLS IN A MEMORY ARRAY TO PERFORM A READ OPERATION AND/OR A WRITE OPERATION

CROSS-REFERENCE TO RELATED APPLICATIONS

This is a continuation of U.S. patent application Ser. No. 13/926,485 (now U.S. Pat. No. 8,681,553), filed on Jun. 25, 2013, which is a continuation of U.S. patent application Ser. No. 13/527,119 (now U.S. Pat. No. 8,472,277), filed on Jun. 19, 2012, which is a continuation of U.S. patent application Ser. No. 13/214,543 (now U.S. Pat. No. 8,203,902), filed on Aug. 22, 2011, which is a continuation of U.S. patent application Ser. No. 12/364,055 (now U.S. Pat. No. 8,004,926), filed on Feb. 2, 2009, which claims priority under the benefit of U.S. Provisional Application No. 61/026,220, filed on Feb. 5, 2008. The entire disclosures of the above-referenced applications are hereby incorporated by reference.

FIELD

The present disclosure relates to memory systems, and more particularly to writing data to memory and reading data stored in memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory devices include an array of memory cells that store information. Memory devices may be volatile or non-volatile. Non-volatile memory devices can retain stored information even when not powered, whereas volatile memory devices typically do not retain stored information when not powered. Examples of memory devices include read-only memory (ROM), random access memory (RAM) and flash memory.

Figure 1:
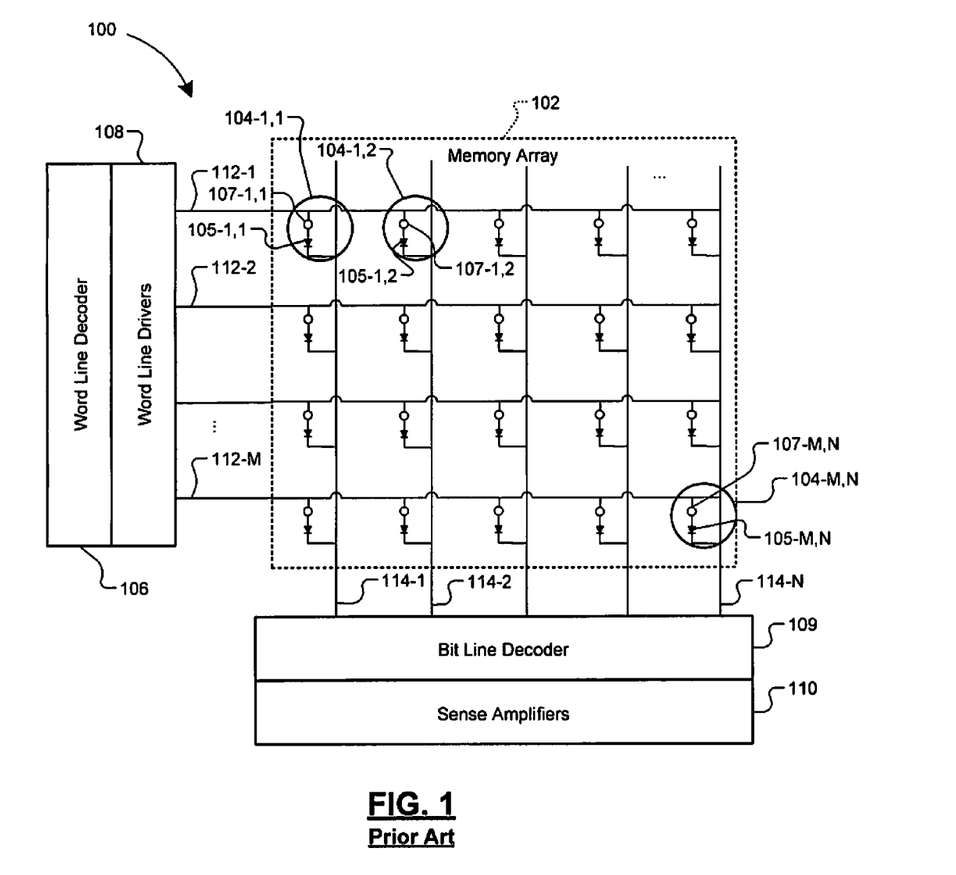
FIG. 1 is a schematic representation of a memory system according to the prior art.

FIG. 1 illustrates a conventional memory system 100. The memory system 100 includes an array 102 of memory cells 104-1,1, 104-1,2 . . . , and 104-M,N (referred to herein as memory cells 104), a word line decoder 106, word line drivers 108, a bit line decoder 109, and sense amplifiers 110. The word line decoder 106 may select one of M rows of memory cells 104 for reading and writing operations via word lines 112-1, 112-2, . . . , and 112-M (referred to herein as word lines 112). The word line drivers 108 may apply a voltage to the selected word line 112 to activate the memory cells 104 in communication with the selected word line 112. The sense amplifiers 110 may detect the presence or absence of data stored in the memory cells 104 via global bit lines 114-1, 114-2, . . . , and 114-N (referred to herein as global bit lines 114). The bit line decoder 109 may select one of N columns of memory cells 104 for reading and writing operations via the global bit lines 114.

Each of the memory cells 104 may include diodes 105-1,1, 105-1,2 . . . , and 105-M,N (referred to herein as diodes 105) and a data storage element 107-1,1, . . . , and 107-M,N (referred to herein as data storage element 107). Alternatively, each of the memory cells 104 may include transistors (not shown) and a data storage element 107. Each diode 105 may communicate with a corresponding word line 112 and a corresponding data storage element 107. Other configurations are possible for the memory cells 104.

Figure 2A:
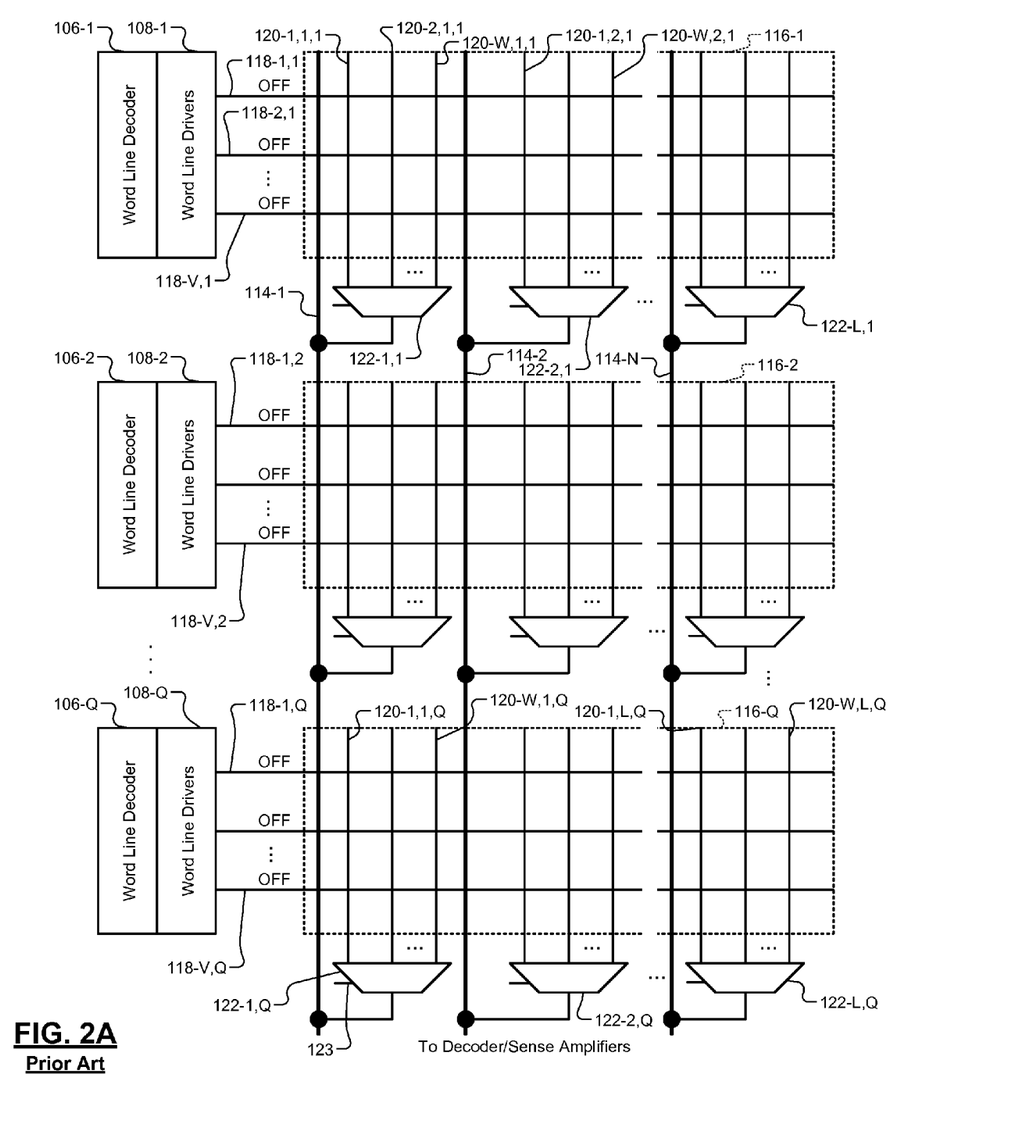
FIG. 2A is a schematic representation of a memory system according to the prior art.
Figure 2B:
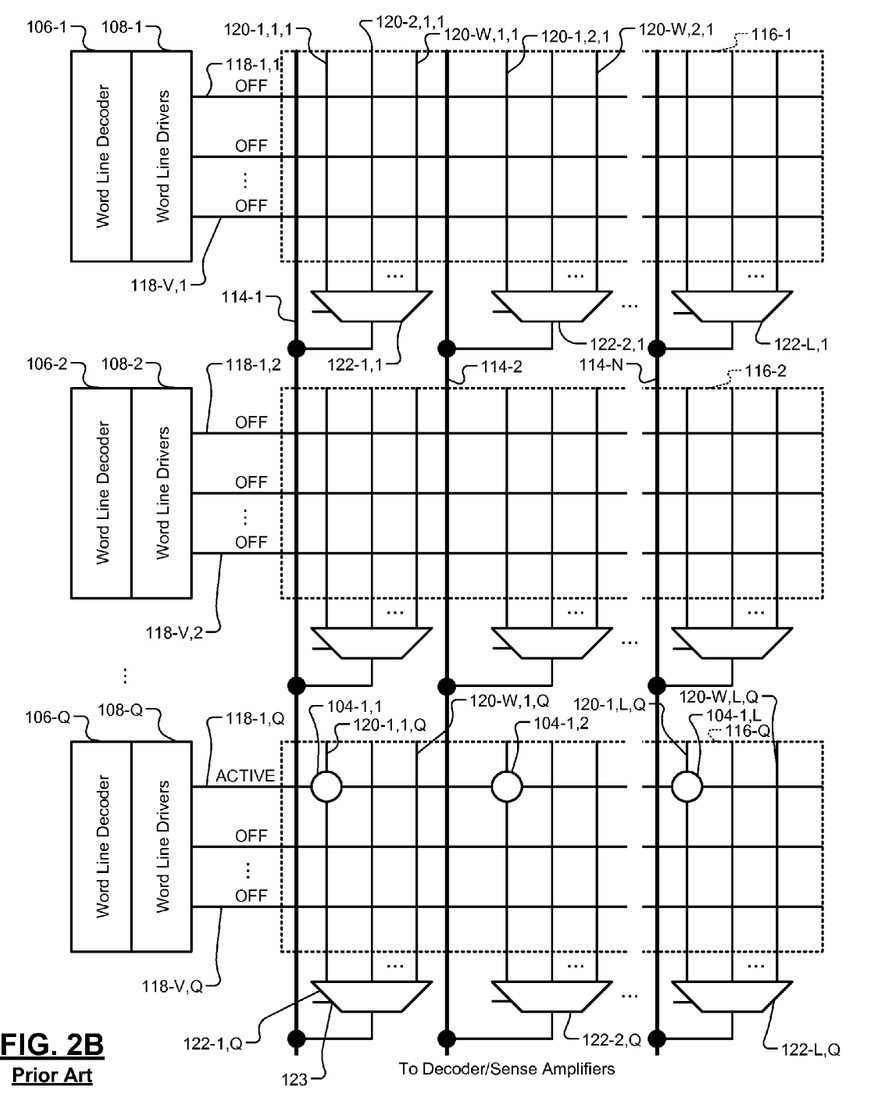
FIG. 2B is a schematic representation of a memory system according to the prior art.

Referring now to FIGS. 2A-2B, the array 102 of memory cells 104 may be arranged in blocks 116-1, 116-2, . . . , and 116-0 (referred to herein as blocks 116). A block 116 may include local word lines 118-1,1, 118-2,1, . . . , and 118-V,Q (referred to herein as local word lines 118) and local bit lines 120-1,1,1, 120-2,1,1, . . . , and 120-W,L,Q (referred to herein as local bit lines 120). Memory cells 104 may be formed at the intersection of the local word lines 118 and the local bit lines 120. The local word lines 118 may communicate with respective word line decoders 106-1, 106-2, . . . , and 106-Q (referred to herein as word line decoders 106) and word line drivers 108-1, 108-2, . . . , and 108-Q (referred to herein as word line drivers 108).

The local bit lines 120 may be arranged in groups. A group of local bit lines 120 may communicate with multiplexers 122-1,1, 122-2,1, . . . , and 122-L,Q (referred to herein as multiplexers 122). Each multiplexer 122 may include a control input 123 that selectively controls which input to the multiplexer will be output from the multiplexer. A read/write (R/W) control module (not shown) may provide the control inputs. A block 116 may communicate with L multiplexers 122, which may select respective local bit lines 120 for reading and writing operations. The multiplexers 122 may communicate with respective global bit lines 114. The global bit lines 114 may communicate with each block 116 in the memory array 102. Bit line decoders 109 and sense amplifiers 110 (shown in FIG. 1) may communicate with the global bit lines 114.

The memory system 100 may include a read/write (R/W) control module (mentioned above). The R/W control module may control R/W operations of the memory cells 104 via the word line decoder 106, the word line drivers 108, the bit line decoder 109, and the sense amplifiers 110. The R/W control module may execute a read cycle to access data stored in one or more data storage elements 107 of the memory cells 104. The R/W control module may also execute a write cycle to store data in one or more data storage elements 107 of the memory cells 104. During each read and write cycle, the R/W control module may access a given memory cell 104 by applying a voltage to a local word line 118 of a block 116 in the memory array 102. During a read cycle, the sense amplifiers 110 may detect the presence or absence of data in a given data storage element 107 of a memory cell 104 in communication with a local word line 118. During a write cycle, the bit line decoders 109 may select a given memory cell 104 for storing data.

For example, as shown in FIG. 2B, local word line 118-1,Q is active. In other words, the word line driver 108-Q may apply a voltage to local word line 118-1,Q. Multiplexers 122-1,Q, 122-2,Q . . . , and 122-L,Q may select local bit lines 120-1,1,Q, 120-1,2,Q . . . , and 120-1,L,Q for reading and writing operations. Thus, memory cells 104-1,1, 104-1,2, . . . , and 104-1,L may be conducting. To read data, the sense amplifiers 110 may detect the presence or absence of data in the memory cells 104 in communication with the selected local word line 118 and the selected local bit lines 120. In the configuration shown in FIG. 2B, L memory cells 104 may be read during a read cycle. To write data, the bit line decoder 109 may select memory cells 104 for storing data via global bit lines 114 and multiplexers 122.

SUMMARY

In general, in one aspect, the present disclosure describes a memory system including a memory array, and a read write/ module. The memory includes a plurality of bit lines, a plurality of word lines, and a plurality of memory cells, in which each memory cell is formed at a corresponding intersection of a bit line and a word line in the memory array. The read/write module is configured to control activation of at least two memory cells in the memory array during a read operation or a write operation, wherein the at least two memory cells activated by the read/write module are located on a different word line and a different bit line in the memory array, and wherein each memory cell coupled to a same bit line of the plurality of bit lines is configured to be written to or read from based on selection of the bit line.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Memory cells may be arranged in arrays of rows and columns of word lines and bit lines, respectively. Capacitive and/or leakage current may cause a voltage drop along a selected word line due to distributed resistance along the word line. The voltage drop may cause voltage conditions of memory cells along the word line to vary. Thus, the voltage required to activate memory cells may vary from memory cell to memory cell. The voltage drop may be significant where a large number of memory cells along a selected word line are activated during a read and/or write operation.

The voltage drop along the word line ($V_{WL}$) may be determined according to the following equation:

$$V_{WL} = (Y \times I_C) \times R_{WL},$$

where Y is the number of activated memory cells in communication with a selected word line, $I_C$ is the capacitive and/or leakage current of each memory cell, and $R_{WL}$ is the distributed resistance of the selected word line. For example, if $I_C$ is 100 μA, N is 1000 and $R_{WL}$ is 100Ω, the voltage drop along the word line may be 10V. Conventionally, due to the voltage drop, word line drivers are typically required to support a higher current and/or a total supply voltage is increased.

The present disclosure describes systems and methods for reading and writing memory cells by reducing the number of activated cells in communication with a selected word line. One method includes segmenting word lines and including multiple word line decoders along the word lines. Another method includes selectively controlling sub-blocks within memory blocks via switches. Using the proposed systems and methods, the voltage drop along a selected word line may be reduced.

Figure 3:
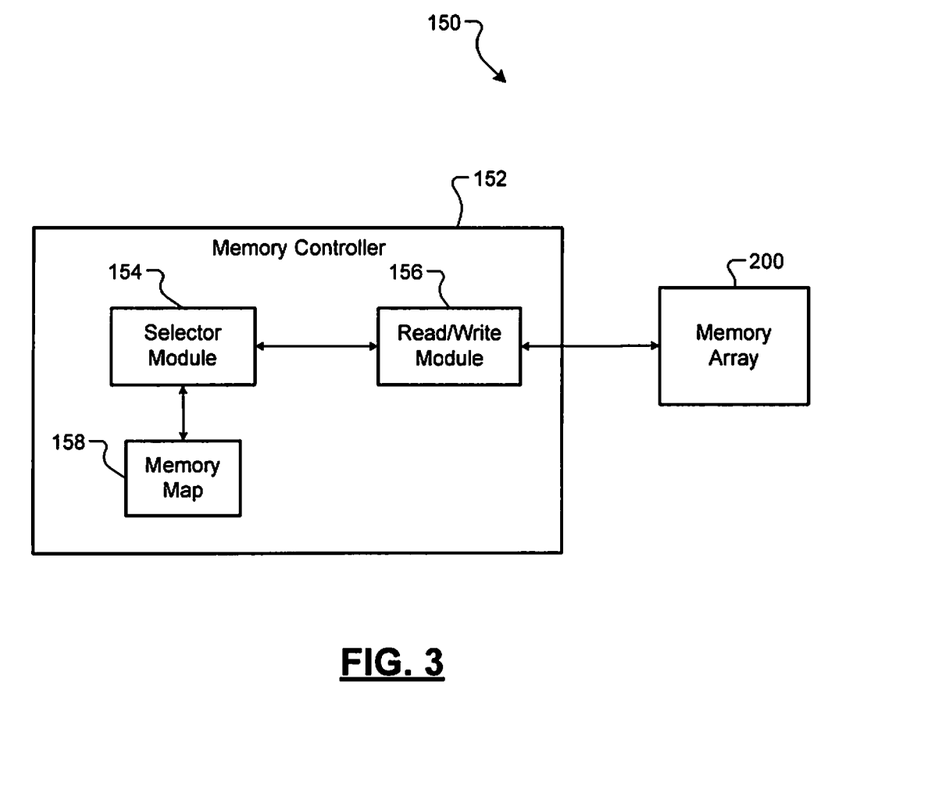
FIG. 3 is a block diagram of a memory system according to the present disclosure.

FIG. 3 illustrates one implementation of a memory system 150 including a memory controller 152 in communication with a memory array 200. The memory controller 152 includes a selector module 154 that may control a read/write module 156 based on a memory map 158. The read/write module 156 selects memory cells of the memory array 200 during read and write operations by selectively controlling word lines and bit lines and/or control devices for word lines or bit lines. Control devices for word lines and bit lines may include decoders, global bit lines and/or switch modules.

Figure 4:
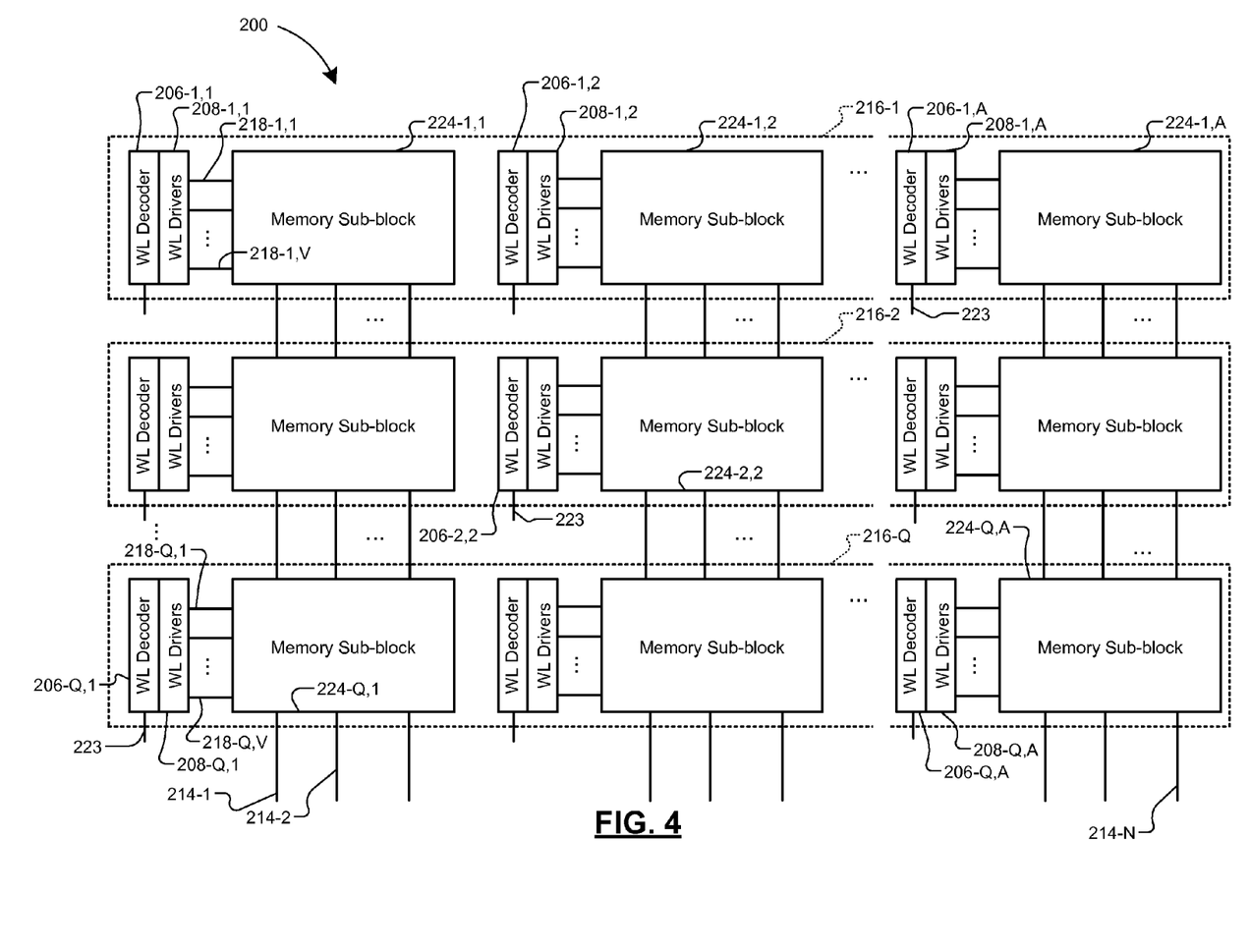
FIG. 4 is a schematic representation of a memory system according to the present disclosure.

Referring now to FIG. 4, a first example of a memory array 200 is shown. The memory array 200 may include blocks 216-1, 216-2, . . . , and 216-Q (referred to herein as blocks 216). A block 216 may be further arranged in a predetermined number of sub-blocks 224-1,1, 224-2,1 . . . , and 224-Q,A (referred to herein as sub-blocks 224). The number of sub-blocks 224 may be proportional to the number of blocks 216. In one implementation, instead of writing data only to memory locations along a word line in a single block, data may be written to memory locations—e.g., multiple sub-blocks—of the same block or among different blocks. A sub-block 224 may communicate with a respective word line decoder 206-1,1, 206-1,2, . . . , and 206-QA (referred to herein as word line decoder 206) and word line drivers 208-1,1, 208-1,2, . . . , and 208-QA (referred to herein as word line drivers 208) via local word lines 218-1,1, 218-1,2, . . . , and 218-Q,V (referred to herein as local word lines 218).

In one implementation, the read/write module 156 may activate memory cells in a sub-block 224 by controlling a respective word line decoder 206 and word line driver 208. Thus, memory cells may be selectively activated in one or more sub-blocks 224 (of the same block 216 or among different blocks 216), while memory cells may remain deactivated in other sub-blocks 224 (of the same block 216 or among different blocks 216). The read/write module 156 may also control global bit lines 214-1, 214-2, . . . , and 214-N (referred to herein as global bit lines 214) that may communicate with multiple sub-blocks 224 within different blocks 216.

For example, the selector module 154 may control word line decoders 206-Q,1, 206-2,2, and 206-1,A via control inputs 223 to allow read/write operations to corresponding sub-blocks 224-Q1, 224-2,2, and 224-1,A. Each sub-block 224 may communicate with a predetermined number of global bit lines 214. For example, when Q=3, so that there are three memory blocks 216 communicating with nine global bit lines 214, each memory block 216 may include three sub-blocks 224 of equal length. Each of the three sub-blocks 224 may communicate with three of the global bit lines 214.

Using conventional techniques, a word line decoder would have been selected, and a memory block corresponding to the word line decoder would have been written to. In contrast, techniques described in the present disclosure permit the selection of multiple word line decoders/word lines for storing data in multiple sub-blocks 224 (associated with one or more blocks 216), rather than a single memory decoder storing data only in a single block 216.

In one implementation, a read/write operation to a particular word line is distributed based on word line decoder selection. In one implementation, both data and access to data in cells of a particular word line is distributed among multiple word lines. The memory map 158 may include data relating to word line decoder selection. For example, the read/write module 156 may determine a number of sub-blocks 224 in a block 216. The read/write module 156 may activate a number of word lines in different blocks corresponding to the number of sub-blocks 224 in the block 216. The read/write module 156 may then selectively activate global bit lines 214 and selectively activate sub-blocks 224 along the global bit lines 214.

Figure 5A:
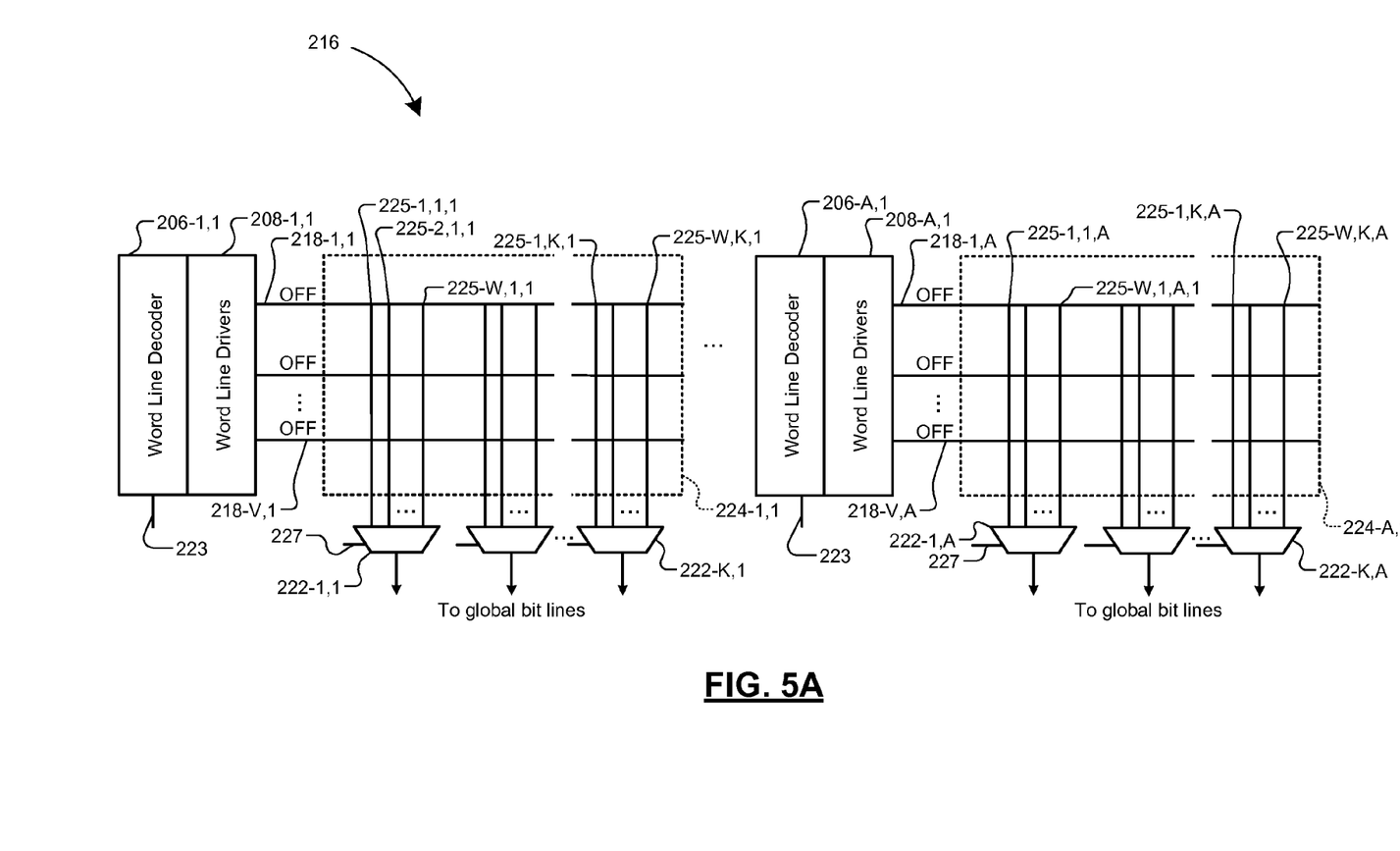
FIG. 5A is a schematic representation of a portion of a memory system according to the present disclosure.
Figure 5B:
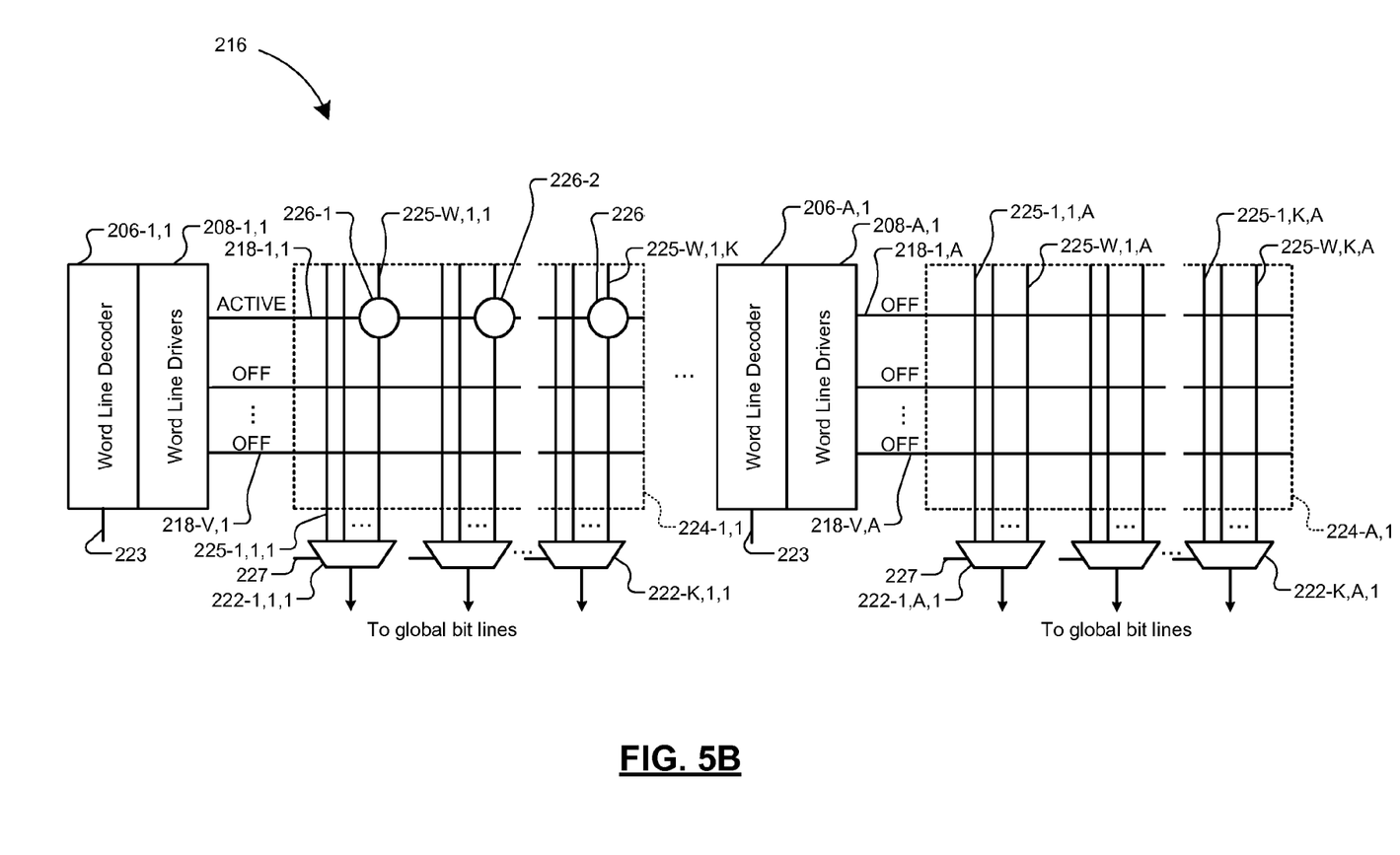
FIG. 5B is a schematic representation of a portion of a memory system according to the present disclosure.

The memory array 200 may be further described with reference to an exemplary block 216 as shown in FIGS. 5A-5B. As shown, a sub-block 224 may include local bit lines 225-1,1,1, 225-1,2,1, . . . , and 225-W,K,A (referred to herein as local bit lines 225). The local bit lines 225 may be arranged in groups, with each group in communication with a respective multiplexer 222-1,1, 222-K,1, . . . , and 222-K,A (referred to herein as multiplexers 222). The multiplexers 222 may select a local bit line 225 from the local bit lines 225 for reading and writing data. Control inputs 227 to the multiplexers 222 may control multiplexer selection of local bit lines 225. The read/write module 156 may provide the control signals to the control inputs 227. The output of the multiplexers 222 may communicate with global bit lines. The global bit lines may communicate with sub-blocks 224 in each block 216 and with a bit line decoder and/or sense amplifiers. Memory cells 226 may be formed at the intersection of the local word lines 218 and the local bit lines 225. The memory array 200 may reduce the voltage drop along a selected word line 218 by reducing the number of activated memory cells 226 in communication with a selected word line 218.

For example, as shown in FIG. 5B, local word line 218-1,1 may be active based on control of word line decoder 206-1,1. Multiplexers 222 may select local bit lines 225-W,1,1, 225-W,1,2 . . . , and 225-W,1,K for reading and writing operations. Thus, memory cells 226-1, 226-2, . . . , and 226-K may be conducting. Memory cells 226 within other sub-blocks 224 may remain deactivated and thus may not be conducting. The selected word line 218 and bit lines 225 in FIG. 5B are exemplary, and other word lines 218 and bit lines 225 may be selected to activate other memory cells 226. Further, memory cells 226 from one or more sub-blocks 224 may be activated for reading and writing operations.

According to one implementation of the present disclosure, the number of activated memory cells 226 along the selected word line 218-1,1 may be given by:

$$Y = Z * \left(\frac{L}{A}\right),$$

where L is the number of multiplexers 222 in a block 216, A is the number of sub-blocks 224 per block 216, and Z is the number of sub-blocks 224 with activated memory cells 226. In a conventional memory array, there may have been L activated memory cells 226 along the selected word line 218-1,1. The voltage drop along the selected word line 218-1,1 may be directly proportional to the number of activated memory cells 226 in communication with the selected word line 218-1,1. Therefore, the voltage drop along the selected word line 218-1,1 may be reduced by a factor of Z/A. For example, if Z is equal to one, as in FIG. 5B, the voltage drop along the activated word line 218-1,1 is reduced by a factor of 1/A.

Figure 6A:
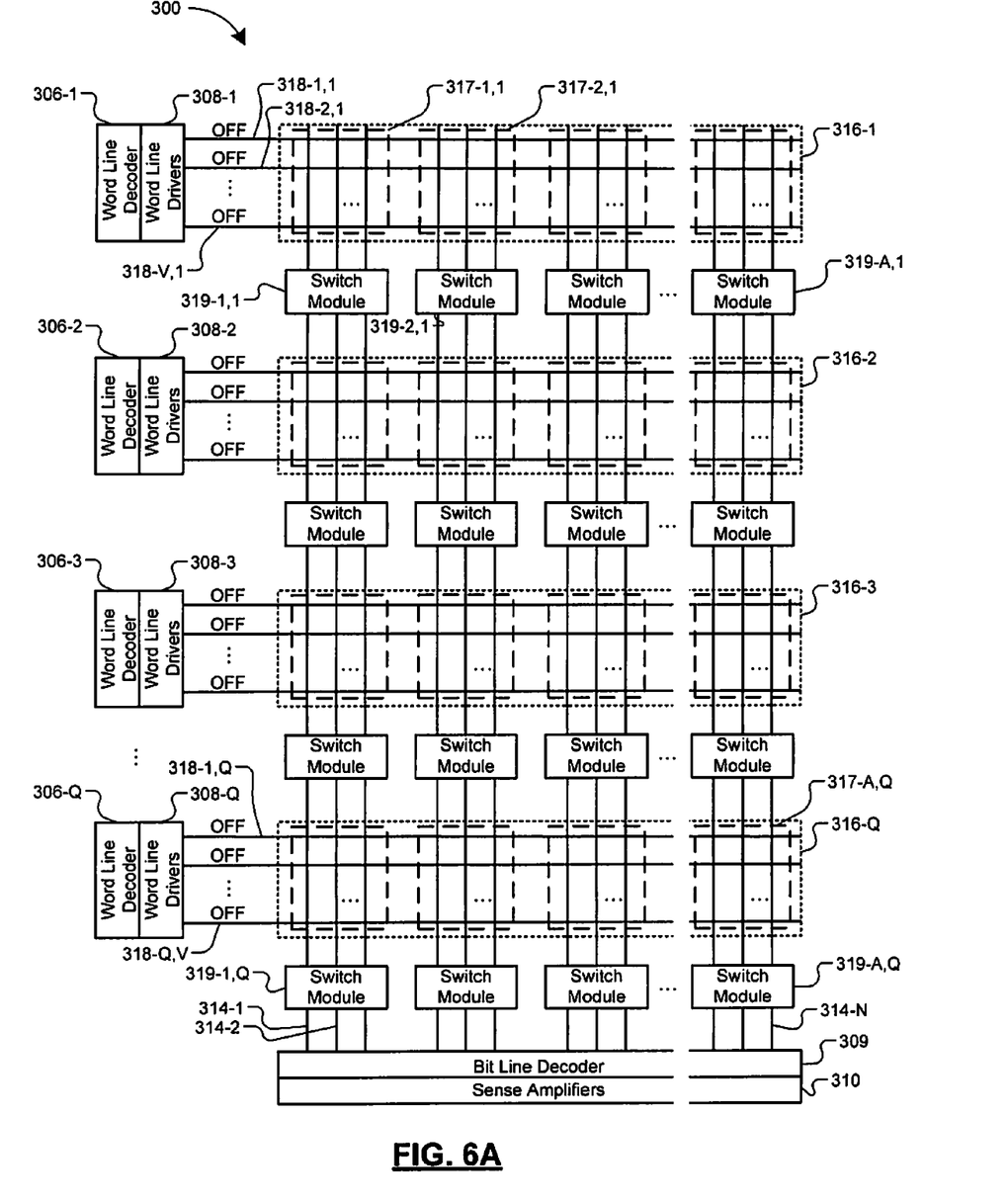
FIG. 6A is a schematic representation of a portion of a memory system according to the present disclosure.
Figure 6B:
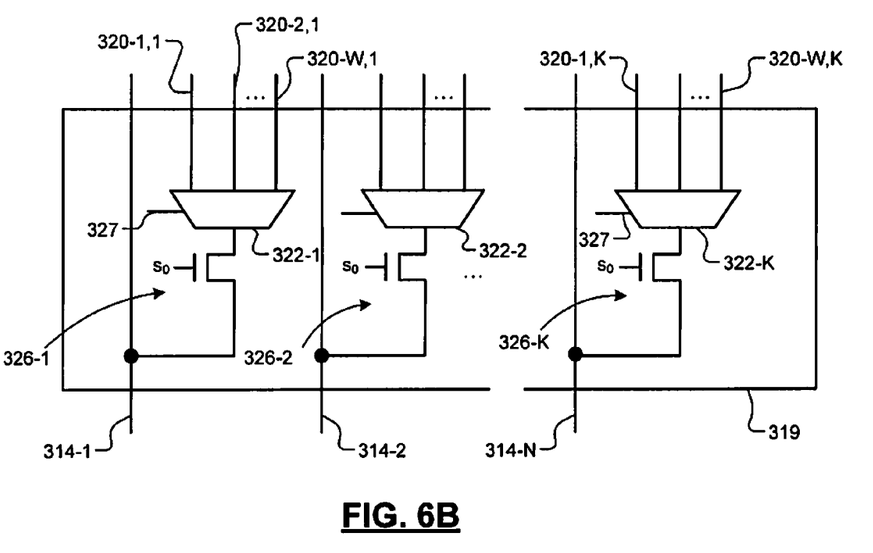
FIG. 6B is a schematic representation of a switch module according to the present disclosure.
Figure 6C:
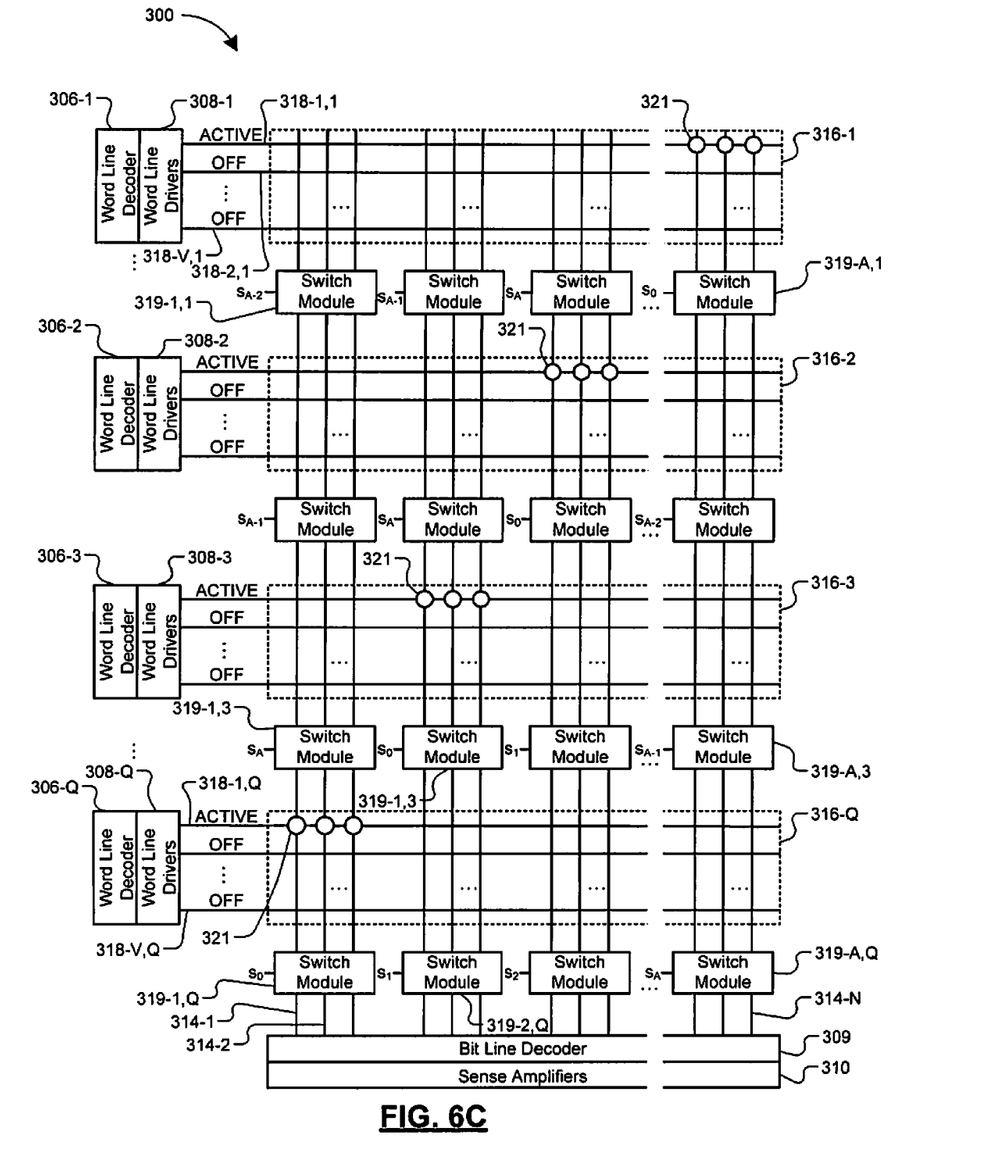
FIG. 6C is a schematic representation of a portion of a memory system according to the present disclosure.

Referring now to FIGS. 6A-6C, a second example of a memory array 300 is shown. The memory array 300 may include blocks 316-1, 316-2, . . . , and 316-0 (referred to herein as blocks 316). A block 316 may communicate with a respective word line decoder 306-1, 306-2, . . . , and 306-Q (referred to herein as word line decoder 306) and word line drivers 308-1, 308-2, . . . , and 308-Q (referred to herein as word line drivers 308) via local word lines 318-1,1, 318-2,1, . . . , and 318 Q,V (referred to herein as local word lines 318). Each block may include a plurality of sub-blocks 317-1,1, 317-2,1, . . . , and 317A,Q (referred to herein as sub-blocks 317).

A block 316 may also communicate with switch modules 319-1,1, 319-2,1 . . . , and 319-A,Q (referred to herein as switch modules 319) via global bit lines 314-1, 314-2, . . . , and 314-N (referred to herein as global bit lines 314) and local bit lines 320-1,1, 320-2,1, . . . , and 320-W,K (referred to herein as local bit lines 320). Each switch module 319 may communicate with a respective sub-block 317. A bit line decoder 309 may select memory cells 321 for reading and/or writing operations via the global bit lines 314. Sense amplifiers 310 may detect the presence or absence of data in the memory cells 321.

Referring now to FIG. 6B, the switch modules 319 may include multiplexers 322-1, 322-2, . . . , and 322-K (referred to herein as multiplexers 322). The read/write control module 156 may provide control signals to control inputs 327 of the multiplexers 322 to control local word line selection. The switch modules 319 may also include switches 326-1, 326-2, . . . , and 326-K (referred to herein as switches 326) that may be controlled by select signals from the selector module 154. The switches 326 within a switch module 319 may be controlled by the same select signal. For example, each switch 326 in a first switch module 319 may be controlled by a first select signal ($s_0$), each switch 326 in a second switch module 319 may be controlled by a second select signal ($s_1$), etc. Thus, each switch 326 within a switch module 319 may be on or off at the same time. Additionally, multiple switch modules 319 may be controlled by the same select signal. For example, a wordline in each K out of Q blocks 316 may be used to turn on K groups of sub-blocks 317 based on control of K×M of the Q×M switches 326 by a corresponding select signal. K may be less than or equal to Q. In one embodiment, the sub-blocks 317 may be grouped into groups of O elements, where O=M/K. The groups may each be controlled by one or more select signals that control, for example, the K×M of the Q×M switches 326. One or more of M/K memory sub-blocks 317 in each of the K out of Q blocks 316 may thus be accessed during a read or write operation.

A block 316 may have Q switch modules 319, with each switch module 319 having L/Q switches, where L is the number of multiplexers 322 per block 316. The memory array 300 may reduce the voltage drop along a selected word line 318 by reducing the number of activated memory cells in communication with the selected word line 318.

In one implementation, within a block 316, each switch module 319 may be controlled by a different select signal ($s_0$-$s_A$), as shown in FIG. 6C. Thus, switches 326 within a switch module 319 may be controlled by the same select signal. The select signals may be arranged so that two or more switch modules 319 in communication with a global bit line 314 may not be selected at the same time. The selector module 154 may provide the select signals based on a memory map 158.

For example, the select signals may be cascaded within the memory array 300 based on the memory map 158. In block 316-Q, switch module 319-1,Q may have a first select signal ($s_0$), switch module 319-2,Q may have a second select signal ($s_1$), ..., and switch module 319-A,Q may have an Ath select signal ($s_A$). In block 316-3, switch module 316-1,3 may have the Ath select signal ($s_A$), switch module 319-2,3 may have the first select signal ($s_0$), ..., and switch module 319-A,3 may have an Ath-1 select signal ($s_{A-1}$). The select signals may be similarly distributed throughout the memory array 300. Thus, by activating the first select signal and activating a word line 318 within each block 316, memory cell activation may be distributed among the blocks 316.

As shown in FIG. 6C, each block 316 may have one activated word line 318. Further, each block 316 may have one activated switch module 319. Thus, there may be K activated memory cells 321 in communication with the activated word line 318 and the activated switch module 319. The memory cells 321 are included to graphically represent memory cells that correspond to local bit lines 320 that are controlled based on global bit lines 314 and are not intended to show memory cells at intersections of global bit lines 314 and word lines 218. Where there are K activated memory cells 321 per activated switch module 319 and A activated switch modules 319, there may be K*A=L activated memory cells 321 per memory array 300. Thus, a total of L memory cells 321 may be read in a read cycle. In a conventional memory array, L memory cells 321 are typically read from a single block 316. In the memory array 300 according to one implementation of the present disclosure, the L memory cells 321 may be read from multiple different blocks 316.

Using the memory array 300 according to the present disclosure, the number of activated memory cells 321 along the selected word line 318 may be given by:

$$Y = \left(\frac{L}{Q}\right),$$

where L is the number of multiplexers 322 in a block 316 and Q is the number of blocks 316. Previously, there may have been L activated memory cells 321 along the selected word line 318. Since the voltage drop along the selected word line 318 is directly proportional to the number of activated memory cells 321 in communication with the selected word line 318, the voltage drop along the selected word line 318 is reduced by a factor of 1/Q.

Figure 7:
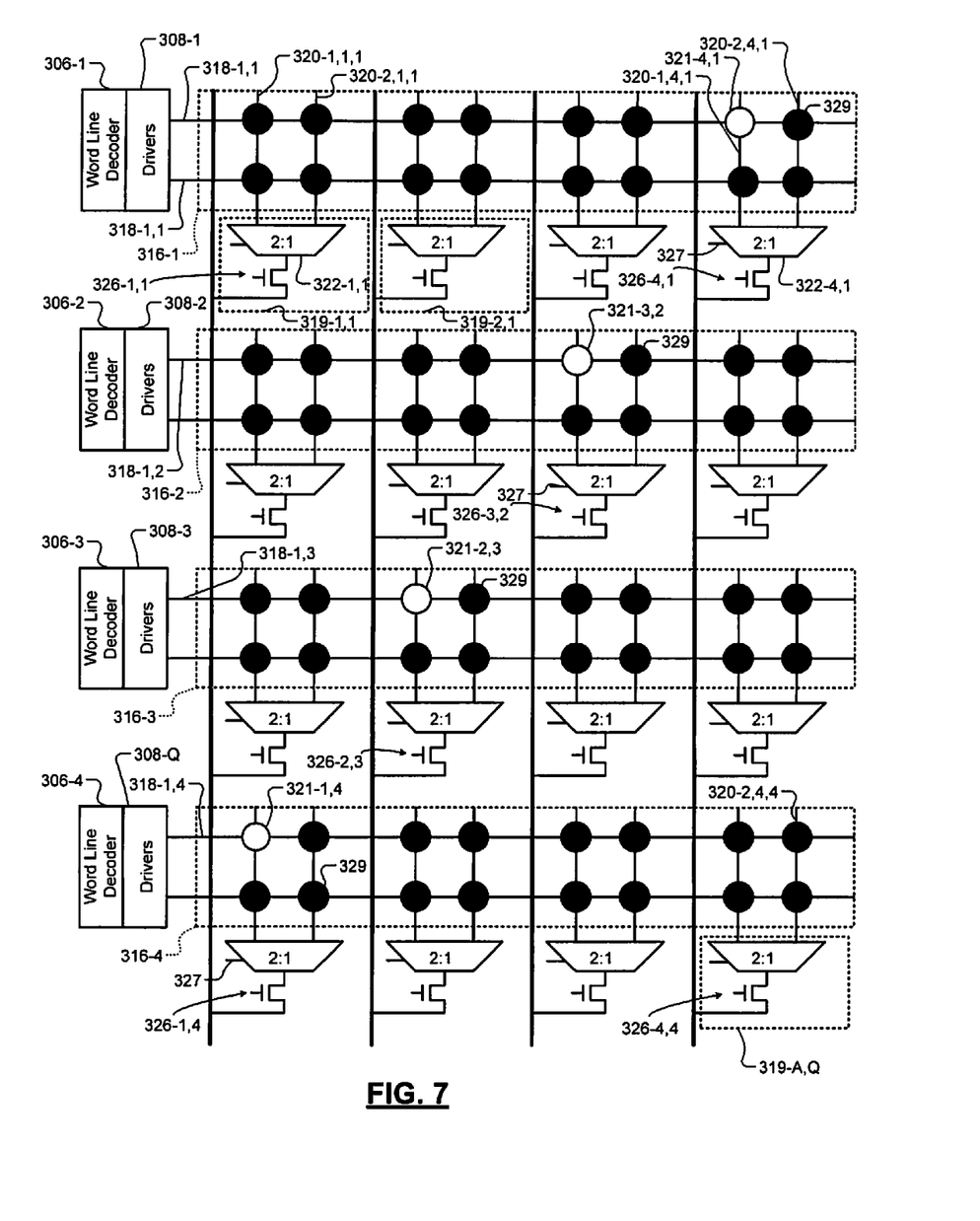
FIG. 7 is a schematic representation of a portion of a memory system according to the present disclosure.

Referring now to FIG. 7 the memory array 300 may be further described. FIG. 7 illustrates an exemplary memory array 300 where Q=4 and L=4. In other words, there are four blocks 316 and four multiplexers 322 per block 316. Where there are four blocks 316, there may be four switch modules 319 per block 316. Each switch module 319 may have L/Q switches 326. In the case shown in FIG. 7, where Q=4 and L=4, there is one switch 326 per switch module 319.

During a read and/or write cycle, one local word line 318 may be activated per block 316. For example, the word line drivers 308 may apply a voltage to local word line 318-1,1, 318-1,2, 318-1,3, and 318-1,4 in each block 316. One select signal may be activated to turn on a set of switches 326. For example, select signal $s_0$ may be activated, thus turning on switches 326-1,4, 326-2,3, 326-3,2, and 326-4,1. As shown in FIG. 7, there may be four activated memory cells 321-1,4, 321-2,3, 321-3,2, and 321-4,1. The remaining select signals ($s_1$-$s_3$) may remain deactivated. Thus there may not be capacitive and/or leakage current flowing through unselected memory cells 329 controlled by select signals $s_1$-$s_3$ and multiplexors because the closed switches 326 prevent current flow.

Thus, the number of activated memory cells 321 along the selected word line 318-1,1 may be given by:

$$Y = \left(\frac{L}{Q}\right) = \left(\frac{4}{4}\right) = 1.$$

In a conventional memory array, there may have been four activated memory cells 321 along the selected word line. Since the voltage drop along the selected word lines 318 is directly proportional to the number of activated memory cells 321 in communication with the selected word lines 318, the voltage drop along the selected word lines 318 is reduced by a factor of ¼.

The broad teachings of this disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory system comprising:
    a memory array, the memory array including
        a plurality of bit lines;
        a plurality of word lines; and
        a plurality of memory cells, wherein
            each memory cell of the plurality of memory cells is located at an intersection of a respective one of the plurality of bit lines and a respective one of the plurality of word lines,
            the plurality of memory cells includes a first memory cell and a second memory cell,
            the first memory cell is located at the intersection of a first bit line of the plurality of bit lines and a first word line of the plurality of word lines, and
            the second memory cell is located at the intersection of a second bit line of the plurality of bit lines and a second word line of the plurality of word lines; and
    a read/write module configured to concurrently activate the first memory cell and the second memory cell to simultaneously access both the first memory cell and the second memory cell.

2. The memory system of claim 1, wherein, while simultaneously accessing both the first memory cell and the second memory cell, the read/write module is configured to perform a read operation or a write operation on either of the first memory cell or the second memory cell.

3. The memory system of claim 1, further comprising a plurality of global bit lines, wherein:
the plurality of global bit lines has a one-to-many relationship with the plurality of bit lines;
the plurality of global bit lines includes a first global bit line and a second global bit line;
the first global bit line corresponds to a first group of the plurality of bit lines;
the first group of the plurality of bit lines includes the first bit line;
the second global bit line corresponds to a second group of the plurality of bit lines; and
the second group of the plurality of bit lines includes the second bit line.

4. The memory system of claim 3, further comprising a plurality of multiplexers, wherein:
the plurality of multiplexers includes a first multiplexer and a second multiplexer;
the first multiplexer is configured to connect one of the first group of the plurality of bit lines to the first global bit line in response to a first control input; and
the second multiplexer is configured to connect one of the second group of the plurality of bit lines to the second global bit line in response to a second control input.

5. The memory system of claim 4, wherein the read/write module is configured to:
provide the first control input to the first multiplexer; and
provide the second control input to the second multiplexer.

6. The memory system of claim 5, wherein the read/write module is configured to provide equivalent values to both the first control input and the second control input.

7. The memory system of claim 5, wherein:
the read/write module is configured to concurrently activate the first memory cell and the second memory cell by (i) setting the first control input to a first value, and (ii) setting the second control input to a second value;
the first value instructs the first multiplexer to connect the first bit line to the first global bit line; and
the second value instructs the second multiplexer to connect the second bit line to the second global bit line.

8. The memory system of claim 4, wherein:
the first group of the plurality of bit lines includes a third bit line;
the second group of the plurality of bit lines includes a fourth bit line;
the plurality of memory cells includes a third memory cell and a fourth memory cell;
the third memory cell is located at the intersection of the third bit line and the first word line; and
the fourth memory cell is located at the intersection of the fourth bit line and the second word line.

9. The memory system of claim 8, wherein:
the read/write module is configured to concurrently activate at most one of the first memory cell and the third memory cell; and
the read/write module is configured to concurrently activate at most one of the second memory cell and the fourth memory cell.

10. The memory system of claim 8, wherein the read/write module is configured to concurrently activate the third memory cell and the fourth memory cell to simultaneously perform a read operation or a write operation on either of the third memory cell or the fourth memory cell.

11. The memory system of claim 8, wherein:
the plurality of bit lines includes a fifth bit line and a sixth bit line;
the plurality of memory cells includes a fifth memory cell and a sixth memory cell;
the fifth memory cell is located at the intersection of the fifth bit line and the first word line;
the sixth memory cell is located at the intersection of the sixth bit line and the second word line;
the plurality of global bit lines includes a third global bit line and a fourth global bit line;
the third global bit line corresponds to a third group of the plurality of bit lines;
the third group of the plurality of bit lines includes the fifth bit line;
the fourth global bit line corresponds to a fourth group of the plurality of bit lines;
the fourth group of the plurality of bit lines includes the sixth bit line;
the plurality of multiplexers includes a third multiplexer and a fourth multiplexer;
the third multiplexer is configured to connect one of the third group of the plurality of bit lines to the third global bit line in response to a third control input; and
the fourth multiplexer is configured to connect one of the fourth group of the plurality of bit lines to the fourth global bit line in response to a fourth control input.

12. The memory system of claim 11, wherein the read/write module is configured to:
provide the third control input to the third multiplexer; and
provide the fourth control input to the fourth multiplexer.

13. The memory system of claim 12, wherein the read/write module is configured to concurrently activate the first memory cell and the fifth memory cell to simultaneously perform a read operation or a write operation on either of the first memory cell or the fifth memory cell.

14. The memory system of claim 13, wherein the read/write module is configured to concurrently activate the second memory cell and the sixth memory cell to simultaneously perform a read operation or a write operation on either of the second memory cell or the sixth memory cell.

15. The memory system of claim 14, wherein the read/write module is configured to concurrently activate the first memory cell, the second memory cell, the fifth memory cell, and the sixth memory cell to simultaneously perform a read operation or a write operation on either of the first memory cell, the second memory cell, the fifth memory cell, or the sixth memory cell.

16. The memory system of claim 1, wherein:
the plurality of memory cells are divided into a plurality of memory sub-blocks;
each memory sub-block of the plurality of memory sub-blocks includes a word line driver to drive respective word lines associated with the memory sub-block;
the plurality of memory sub-blocks includes a first memory sub-block and a second memory sub-block;
the word line driver of the first memory sub-block is configured to selectively drive the first word line; and
the word line driver of the second memory sub-block is configured to selectively drive the second word line.

17. The memory system of claim 16, wherein:
the word line driver of the first memory sub-block is configured to simultaneously drive at most one of the plurality of word lines; and
the word line driver of the second memory sub-block is configured to simultaneously drive at most one of the plurality of word lines.

18. The memory system of claim 16, wherein the read/write module is configured to:

activate the first memory cell exclusive of the second memory cell by (i) instructing the word line driver of the first memory sub-block to drive the first word line and (ii) instructing the word line driver of the second memory sub-block to not drive the second word line;

activate the second memory cell exclusive of the first memory cell by (i) instructing the word line driver of the first memory sub-block to not drive the first word line and (ii) instructing the word line driver of the second memory sub-block to drive the second word line; and activate the first memory cell and the second memory cell simultaneously by (i) instructing the word line driver of the first memory sub-block to drive the first word line and (ii) instructing the word line driver of the second memory sub-block to drive the second word line.

19. The memory system of claim 1, wherein the plurality of memory cells comprise volatile memory cells.

20. The memory system of claim 1, wherein the plurality of memory cells comprise non-volatile memory cells.

* * * * *